(12) United States Patent
McCalib, Jr. et al.

(10) Patent No.: US 10,474,980 B1
(45) Date of Patent: Nov. 12, 2019

(54) SECURED DELIVERY PROCESS UTILIZING MANUFACTURED TEMPORARY KEYS

(71) Applicant: Amazon Technologies, Inc., Seattle, WA (US)

(72) Inventors: David Bruce McCalib, Jr., Seattle, WA (US); Harrison Holmes Jones, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 458 days.

(21) Appl. No.: 15/335,616

(22) Filed: Oct. 27, 2016

(51) Int. Cl.
| | |
|---|---|
| *G06Q 10/08* | (2012.01) |
| *B21D 53/42* | (2006.01) |
| *G06F 17/50* | (2006.01) |
| *H04N 7/18* | (2006.01) |

(Continued)

(52) U.S. Cl.
CPC ........... *G06Q 10/083* (2013.01); *B21D 53/42* (2013.01); *E05B 19/26* (2013.01); *G06F 17/5086* (2013.01); *G06K 9/00771* (2013.01); *H04N 7/183* (2013.01); *H04N 7/188* (2013.01); *G05B 2219/33099* (2013.01)

(58) Field of Classification Search
CPC ........ H04N 7/185; H04N 7/186; H04N 7/183; H04N 7/188; G07C 9/00142; G07C 2209/63; G07C 9/00; G07C 9/00103; G07C 2009/0042; G07C 2009/0092; G06Q 10/083; G06Q 10/0833; A47G 29/14; H04W 88/02; H04W 12/08; H04L 63/062; G07F 17/10; G01S 19/51; B21D 53/42; E05B 19/26; G06F 17/5086; G06K 9/00771; G05B 2219/33099

See application file for complete search history.

(56) References Cited

U.S. PATENT DOCUMENTS

| | | | |
|---|---|---|---|
| 6,647,308 B1 * | 11/2003 | Prejean | ..................... B23C 3/35 |
| | | | 700/117 |
| 2015/0095213 A1 * | 4/2015 | Paintin | .................. B33Y 80/00 |
| | | | 705/39 |

(Continued)

OTHER PUBLICATIONS

Cirqoid PCB prototyping tools, Aug. 27, 2016, cirqoid.com via archive.org (Year: 2016).*

(Continued)

*Primary Examiner* — Kevin H Flynn
*Assistant Examiner* — Michelle E Carey
(74) *Attorney, Agent, or Firm* — Lee & Hayes, P.C.

(57) ABSTRACT

A system for providing access to delivery locations with added security. The system can include a database of images (or other data) of keys associated with a plurality of delivery addresses, or secure delivery locations. When a special handling item—i.e., one that cannot safely be left outside the delivery location—is ordered, the system creates a key to provide access to the secure delivery location. The key can be a one-time use, disposable, shreddable, or otherwise temporary key. The system can also utilize one or more video cameras to record some or all of the delivery process to ensure the delivery driver delivers the item(s), destroys or leaves the key, and leaves the secure delivery location locked, among other things. The manufacturing of a key and/or the choice to use secure delivery can be based on the delivery location, product, delivery value, perishability, or other factors.

11 Claims, 7 Drawing Sheets

(51) Int. Cl.
*G06K 9/00* (2006.01)
*E05B 19/26* (2006.01)

(56) References Cited

U.S. PATENT DOCUMENTS

| | | | | |
|---|---|---|---|---|
| 2015/0235495 | A1* | 8/2015 | Hall | G07C 9/00896 |
| | | | | 340/5.51 |
| 2015/0301338 | A1* | 10/2015 | Van Heugten | G02C 7/04 |
| | | | | 345/8 |
| 2015/0310381 | A1* | 10/2015 | Lyman | G06Q 10/083 |
| | | | | 705/330 |
| 2016/0360160 | A1* | 12/2016 | Eizenberg | G06Q 30/0207 |
| 2017/0137128 | A1* | 5/2017 | Natarajan | B64C 39/024 |
| 2017/0246640 | A1* | 8/2017 | Wagner | B02C 18/142 |
| 2017/0324711 | A1* | 11/2017 | Feeney | H04L 63/0428 |
| 2017/0330145 | A1* | 11/2017 | Studnicka | G06Q 10/0836 |

OTHER PUBLICATIONS

Cirqoid Consumables: PCB laminate, May 29, 2016, circoid.com/collections/consumables/products/pcb-laminate via archive.org (Year: 2016).*

Pierce, David, "Its Way Past Time for Every Phone to Be Waterproof", Sep. 2, 2016, Wired, via www.wired.com/2016/09/way-past-time-every-phone-waterproof/ (Year: 2016).*

Track Pin delivery system, Archive.org screen capture of Oct. 1, 2016, http://trackpin.com/garage-mobile-app/ (Year: 2016).*

Smart Door and Delivery, Archive.org screen capture of Oct. 14, 2016, https://smartdooranddelivery.com/ (Year: 2016).*

* cited by examiner

To Fig. 3B

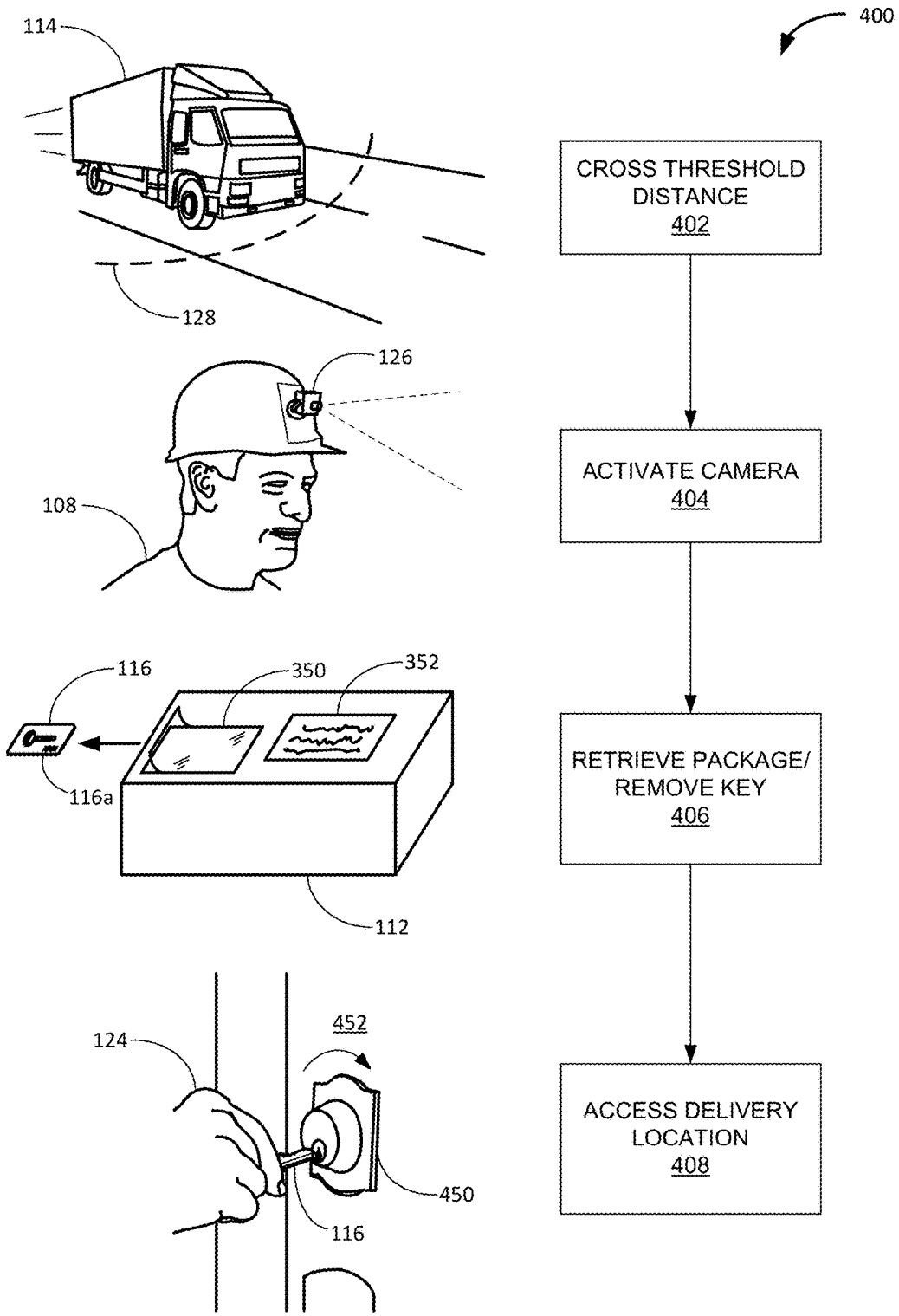

US 10,474,980 B1

SECURED DELIVERY PROCESS UTILIZING MANUFACTURED TEMPORARY KEYS

BACKGROUND

Home delivery for many products is available in a wide variety of locations. The proliferation of the internet and online retailers, for example, means that users can order everything from televisions to groceries online (or on the phone). In many cases, these items can be delivered next day, or even within a couple of hours.

Some items, however, should not be left by the delivery driver outside a delivery location—e.g., on the front stoop or by the garage door—due to theft, spoilage, or other concerns. Extremely expensive items, for example, may be stolen if they are left outside. Other items may be adversely affected by extreme temperatures or wet conditions, among other things. Groceries and other perishables may simply spoil or melt, for example, before they can be put away. Thus, expensive packaging, dry ice, or other means may be used to ensure the products are received as expected.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

FIGS. 4A and 4B are flowcharts depicting an order delivery with keyed access, in accordance with some examples of the present disclosure.

DETAILED DESCRIPTION

Examples of the present disclosure are related to systems and methods for providing keyed access to delivery locations for special handling deliveries. The system can include a database of key data, including images, digital representations, 3-D drawings, or other electronic representation of physical keys. The system can also include a key machine capable of rapidly manufacturing keys from the key data included in the appropriate key file. The keys can be a one-time-use, disposable, shreddable, or otherwise temporary key. A delivery driver can use the key to access the deliver location to deliver a package that cannot easily be left outside due to its value or perishability, among other things. The delivery can be recorded on video, which can be provided to the user at the conclusion of the delivery.

When a user orders products online, in many cases the products can simply be left outside at a delivery location. It is common for delivery companies to leave packages by the front or rear door, the garage, or in other outdoor locations. Some products, however, cannot easily be left outside. This may be because they are particularly valuable, perishable, or confidential, among other things. Particularly valuable items, for example, may be stolen if left outside. Groceries may require insulated packaging and ice to prevent spoilage, for example, which increases costs. Even with these special accommodations, groceries left outside on a hot day may nonetheless spoil within a matter of hours.

As a result, it would be useful to be able to deliver packages to secure locations using a secure, trusted, and temporary access method. Placing valuable or perishable items inside a locked car, a locked house, or even inside a refrigerator or freezer can reduce the costs associated with theft and spoilage and provide additional service to the user. The system can provide video evidence of the delivery to document the delivery process. It is to such systems and methods that examples of the present disclosure are primarily directed.

The techniques, machines, and systems described herein may be implemented in a number of ways. Example implementations are provided below with reference to the following figures.

Figure 1:
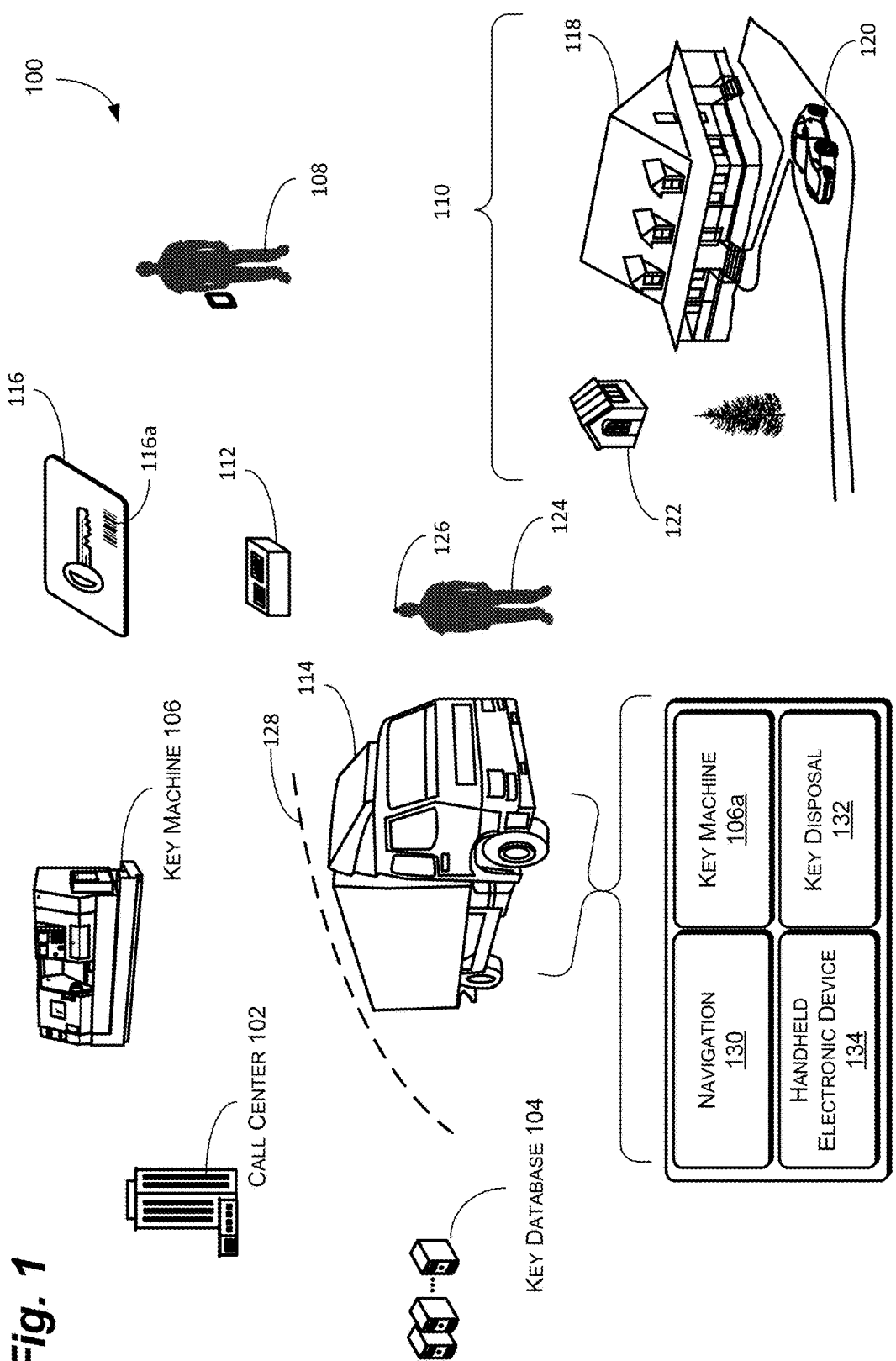
FIG. 1 is a schematic diagram of an illustrative environment that includes keyed access to a variety of delivery locations, in accordance with some examples of the present disclosure.

FIG. 1 is a schematic diagram of an illustrative delivery system 100 that includes a call center 102, a key database 104, and a key machine 106. As discussed below, when an order is received from a user 108 that requires special handling—i.e., delivery to a secure delivery location 110—the call center 102 can receive the order and authorization from the user 108 to access the secure delivery location 110 and begin the fulfillment process. In some examples, the user 108 can be in communication with the system 100 via a smart phone (or tablet, laptop, or other device).

The call center 102 can comprise, for example, a call center, website, retail or wholesale store, or a combination thereof. Thus, the call center 102 can receive orders from users for various products using a number of channels (e.g., the voice calls, internet websites, applications, etc.). Some of the products may require special handling, while others may not. Thus, in some cases, special handling items may be packaged and delivered separately. In other cases, any order that contains at least one special handling item can be delivered using the system 100.

In either case, the call center 102 can receive the order and locate the one or more items 112 requested in the order in inventory. As discussed below with reference to FIG. 5, the call center 102 can include one or more computers, servers, or banks of servers associated with one or more warehouses that store the aforementioned products. Thus, an order can be received at the call center 102, the products can be located in inventory and pulled by one or more warehouse robots or workers and packaged for delivery. Once the order is fulfilled (e.g., the items are pulled from the shelves), the call center 102 can place the one or more items 112 in one or more packages and label the package(s) for delivery.

For packages that do not require special handling, the item(s) 112 can then be placed on a delivery vehicle 114 for delivery. Of course, while the delivery vehicle 114 is depicted as a truck, it could also be a car, motorcycle, unmanned aerial vehicle (UAV), scooter, or other vehicle. The delivery vehicle 114 can then deliver the item(s) 112 in the conventional manner.

For item(s) 112 that do require special handling, on the other hand, in addition to receiving, pulling, and packaging the order, the call center 102 can also manufacture a temporary key 116 that provides access to the secure delivery location 110. As discussed below, in some examples, the temporary key 116 can be attached to, or otherwise associated with, the item(s) 112. In other examples, the temporary key 116 can include an identifier 116a. The identifier 116a can comprise, for example, a bar code, alphanumeric code, password, or other word, letter, or symbol to anonymize the temporary keys 116. In this manner, the call center 102, for example, may be unaware at the time the temporary key 116 is manufactured to which secure delivery location 110 the temporary key 116 belongs. The temporary key 116 may be associated with the secure delivery location 110 at a later point in the delivery (e.g., when the item(s) 112 arrive at the secure delivery location 110).

As shown, the secure delivery location 110 can comprise, for example, a house 118 or business, a vehicle 120 (e.g., a car or truck), a garden shed 122, or any other location that can be locked, or otherwise secured. Thus, for expensive goods, for example, the driver 124 can place the item(s) 112 in the vehicle 120, or trunk of the vehicle 120, and then lock the vehicle 120 behind them. Similarly, the driver 124 can place the item(s) 112 inside the door of the house 118 or inside a lockable garden shed 122, for example, and then lock the door behind them.

In some examples, such as for the delivery of groceries, the driver 124 may place some or all of the order directly in the user's refrigerator or freezer. This can reduce the cost associated with the delivery of groceries in several ways. Placing the groceries in the refrigerator prevents spoilage, for example, even if the user 108 is out of town for several days. Placing the groceries in the refrigerator also reduces or eliminates special packaging, such as coolers or dry ice, required to keep the groceries cool outside the refrigerator.

In some examples, the item(s) 112 may be fulfilled at the call center 102 and delivered in such a short amount of time as to preclude any additional packaging. In this case, the driver 124 can place some, or all, of the items(s) 112 in the refrigerator and/or freezer upon delivery. In some examples, refrigerated, frozen, and non-perishable items 112 may be packaged separately. In this configuration, the driver 124 does not need to unpack items, but simply places each box or package in the appropriate location. In other examples, the item(s) 112 can include an open tote, for example, and the driver can put each item in an appropriate location upon delivery.

In addition to reducing or obviating insulated packaging and/or ice, secure deliveries can reduce the cost associated with delivering the item(s) 112 in general. In other words, because the driver 124 does not have to wait for the user 108 to answer the door and/or provide a signature, for example, the time required to deliver the item(s) 112 can be reduced. Because no user 108 involvement is required, the cost to redeliver the item(s) 112 multiple times due to missed deliveries is eliminated. In addition, the costs associated with lost or damaged item(s) 112 due to theft, weather, and other factors can also be reduced or eliminated.

As discussed below, the temporary key 116 can be manufactured from a number of materials and using multiple manufacturing methods. In some examples, the temporary key 116 can be manufactured using computer numerically controlled (CNC) manufacturing process using, for example, a multi-axis CNC milling machine, a 3-D printer, or other rapid manufacturing methods. In some examples, the temporary key 116 can be manufactured at, or near, the same time the call center 102 receives the order and can be attached to the item(s) 112 or provided to the driver 124. This can help reduce potential security risks associated with the temporary key 116 being manufactured in advance. In some examples, the temporary key 116 can be attached to the item(s) 112 using tamper-evident packaging to prevent unauthorized use or copying of the temporary key 116.

In some examples, after putting the item(s) 112 in an appropriate location, the temporary key 116 can simply be locked in the secure delivery location 110 as the driver 124 leaves. The driver 124 can place the item(s) 112 in the vehicle 120 or house 118, for example, place the temporary key 116 inside the vehicle 120 or house 118, and then lock the door from the inside and close the door. In this manner, when the user 108 retrieves the item(s) 112, they are also provided with the temporary key 116. This eliminates any worry the user 108 may have with the driver 124, or others, possessing a key to their house 118 or vehicle 120. As discussed below, in some cases, the temporary key 116 can be easily destroyed by the user 108 or driver 124 by hand, using scissors, using a glass of water, or other readily available means.

In some examples, the user 108 may prefer that the house 118 be secured with a deadbolt that can only be locked from the outside with the temporary key 116. In other examples, the user 108 may have a vehicle 120 that can only be locked with the temporary key 116 from the outside. In still other examples, the user 108 may simply have a lock or type of door that cannot be locked from the inside without the temporary key 116. In this configuration, the driver 124 can close the door, lock the deadbolt, car door, or other locks and then push the key under the door, through a mail slot, or place the key inside a lockbox or secure mailbox located outside the house 118 or vehicle 120. The lockbox can have a slot, for example, to enable the temporary key 116 to be inserted, but prevent unauthorized access. The user 108 can then access the lockbox using an appropriate key to secure and/or destroy the temporary key 116.

In still other examples, the temporary key 116 can be manufactured from a material that enables the key to be easily destroyed or to self-destruct after a predetermined amount of time. In some examples, the temporary key 116 can be made from a hydroscopic material, for example, that swells, becomes flexible or weak, or otherwise unusable due to exposure to the moisture in the air. In other examples, the temporary key 116 can be manufactured from an oxidizing material that rusts or breaks down due to exposure to the air itself. In yet other examples, the temporary key 116 can be heat sensitive. Thus, the temporary key 116 can remain usable when kept cold in the package, for example, but then break down due to exposure to higher temperatures (e.g., room temperature). Regardless of the mechanism, the temporary key 116 can be rendered useless after exposure to one or more conditions.

In some examples, the temporary key 116 may be effective for a predetermined amount of time (e.g., 5 or 10 minutes), below or above a predetermined temperature, or until exposed to air or water. After the predetermined amount of time, for example, the temporary key 116 may swell to the point that it will no longer fit the lock or become flexible, weak, or otherwise fail structurally to prevent continued use. As discussed below, in some examples, the temporary key 116 can be kept in an airtight envelope until the driver 124 reaches the secure delivery location 110.

In yet other examples, rather than the temporary key 116 being passively destroyed due to exposure to air or water, for example, the user 108 or the driver 124 can actively destroy the temporary key 116. The temporary key 116 can be manufactured from a polymer, paperboard, or other material, that can be ripped, broken, or shredded by the driver 124 or user 108. In some examples, the temporary key 116 may have an intentional fault, such as a score line, manufactured into it. In this manner, the driver 124 can use the key to access the secure delivery location 110, but then break it along the fault line to destroy it. The temporary key 116 can be manufactured from a relatively brittle material, for example, such that it can easily unlock and lock the door on the house 118, for example, but shatters when dropped on a hard surface. In some example, the temporary key 116 can be manufactured from paper, cardboard, or plastic, which can be ripped or cut up with scissors. In some examples, as discussed below, the delivery vehicle 114 or the driver 124 can include a shredder to shred the temporary key 116 after use. The temporary key 116, or evidence of its destruction, can be provided to the user 108 after the delivery is completed.

In some examples, to provide additional piece-of-mind to the user 108, some or all of the delivery can be recorded using one or more cameras 126. In some examples, the camera(s) 126 can include one or more wearable body cameras worn by the driver 124. In some examples, the camera(s) 126 can be a conventional digital camera worn on the driver's shirt, lapel, or on a lanyard around the driver's neck. In other examples, the camera(s) 126 can comprise a 360-degree camera worn on the driver's helmet or hat. In this manner, the user 108 can rotate the view in any direction when reviewing the video or images of the delivery. The camera(s) 126 can provide periodic still images or video of the delivery. As discussed blow, the camera(s) 126 can be activated based on the driver's proximity to the secure delivery location 110 or can simply be on all the time.

In some examples, the driver's entire shift can be recorded and uploaded to a server each day. The server may be located at the call center 102, for example, at another location, or in the cloud. The server can then store video files for all drivers 124 for a predetermined period of time (e.g., three days or one week) similar to store security cameras. In this manner, if there are any concerns regarding a secure delivery, the video can be reviewed to identify any issues. After the predetermined amount of time, the videos can be destroyed or overwritten to reduce storage needs.

In other examples, the camera(s) 126 can be activated at a predetermined time or distance prior to the delivery and deactivated at a predetermined time or distance after the delivery. In this configuration, at some time after the item(s) 112 have been delivered, the video file can be uploaded to the call center 102, a server, or sent to the user 108 for review, if desired. In some examples, the video can be associated with the user's order or account. In this manner, the user 108 can review the video, along with other details of the order, on the website or application ("app") from which the user 108 placed the order in the first place. In other words, in addition to details like when the order was placed, shipped, the cost, method of payment, delivery status, and other conventional order information, the user 108 can also have access to a video clip of the delivery. In some examples, the video can be included in the same location (e.g., "My Account" or "Order Status") on the website or app as the conventional order information.

In some examples, the camera(s) 126 can be activated in response to crossing a threshold distance 128. Thus, when the delivery vehicle 114 is within a predetermined distance (e.g., 100 feet, 100 yards, ½ mile, etc.) of the secure delivery location 110, the camera(s) 126 can be activated to begin recording the delivery. In this manner, the camera(s) 126 can capture the driver 124, for example, approaching the secure delivery location 110, retrieving the item(s) 112 from the delivery vehicle 114, accessing the temporary key 116, unlocking and re-locking the secure delivery location 110, destroying and/or disposing of the temporary key 116, and leaving the secure delivery location 110.

In this manner, the video can be used to assure the user 108 that the driver 124 has only accessed the secure delivery location 110 for appropriate purposes. The user 108 is also assured that the temporary key 116 has been appropriately destroyed or left behind. The user 108 is also assured that the driver 124 has not damaged the secure delivery location 110 with the delivery vehicle 114 (e.g., hit the house or driven in the lawn). In this manner, the system 100 builds trust with the user 108 and incentivizes proper driver 124 performance. In some examples, the images can also be analyzed for performance and efficiency to improve the delivery process.

In some examples, some of the components of the system 100 can be located in the delivery vehicle 114. In some examples, the delivery vehicle 114 can include one or more navigation systems 130. The navigation systems 130 can include, for example, global position system (GPS) receivers, cellular location services, long-range navigation (LORAN), and/or other navigation systems to enable the driver 124 to locate the secure delivery location 110. In some examples, such as when the secure delivery location 110 is the vehicle 120, the navigation system 130 can also provide the make, model color, and/or tag number of the vehicle 120. In some examples, the navigation system 130 can also include automatic license plate recognition (ALPR) systems to assist the driver in locating the appropriate vehicle 120, for example, and to verify the secure delivery location 110.

In other examples, the navigation system 130 can also provide other details about the secure delivery location 110. The navigation system 130 can include a comments section that provides, for example, "Leave in shed. Key for padlock." or "Please place package in refrigerator." The comments can also include special instructions such as "Hold handle to relock door." or "Dog is not dangerous, but very friendly."

In some examples, rather than being located at the call center 102, the key machine 106a can be located in the delivery vehicle 114. Because the temporary key 116—and keys in general—are relatively small, the working area of the key machine 106a can also be small. As a result, the key machine 106a can comprise a tabletop CNC milling machine, for example, or 3-D printer. The key machine 106a can be mounted on the dash, in place of a passenger seat, or in the cargo area of the delivery vehicle 114.

In this manner, the temporary key 116 can be manufactured in the delivery vehicle 114 when the delivery vehicle 114 crosses the threshold distance 128. In this manner, the temporary key 116 may be less likely to be misplaced or damaged in transit, among other things. In still other examples, the driver 124 can request the temporary key 116 after arriving at the secure delivery location 110, further reducing risk.

In some examples, the delivery vehicle 114 can also include a key disposal unit 132. Depending on the type of temporary key 116 used, the key disposal unit 132 can comprise a shredder, lock box, or liquid tank, among other things. Suitably thin temporary keys 116, for example, can be placed in a shredder and shredded (or cross-shredded) to a suitable size to prevent their reuse. In other examples, the key disposal unit 132 can comprise a lock box with a slot, for example, that enables the temporary key 116 to be inserted by the driver 124 after the delivery, but not removed. This portion of the delivery can be recorded by the camera(s) 126 to provide the user 108 with evidence that the key has been disposed of securely. The temporary keys 116 can then be emptied from the lockbox periodically in a secure manner by a supervisor, security personnel, or other appropriate authority. The temporary keys 116 can be retrieved and destroyed in a dedicated location at the call center 102, for example, or in a dedicated location remote to the call center 102.

In still other examples, the key disposal unit 132 can comprise a fluid tank. In this configuration, temporary keys 116 can be dissolved, swelled, weakened, or otherwise transformed by soaking them in a fluid to prevent their reuse. In the case of paper and cardstock, water-soluble plastics, hydroscopic materials, and other materials affected by water, the key disposal unit 132 can simply comprise a tank of water. Plastics and other materials, on the other hand, can be dissolved, melted, or distorted using a suitable solvent. Regardless of the fluid, the temporary keys 116 can be rendered unusable by exposure to the fluid.

In still other examples, the key disposal unit 132 can use heat to destroy the temporary keys 116. Thus, the key disposal unit 132 can comprise an oven, incinerator, burner, or other device designed to melt or burn the temporary keys 116. Polymer temporary keys 116, for example, may simply be heated to the melting point of the polymer to cause the polymer to shrink, bend, or otherwise become misshapen. Paper or cardboard keys, on the other hand, are easily incinerated into ashes.

Regardless of the type of key disposal unit 132, the key disposal process can be included in the video of the delivery process. Thus, the video can show the driver 124 shredding the temporary key 116, for example, or placing the temporary key 116 in a lockbox. Once again, in this manner, the user 108 is provided with evidence that the temporary key 116 has been disposed of appropriately.

In some examples, the delivery vehicle 114 can also include a handheld electronic device 134. The handheld electronic device 134 can be carried by the driver 124 or can be installed in the delivery vehicle 114. The handheld electronic device 134 can comprise, for example, a cell phone or tablet computer to provide the driver with delivery information and to provide the call center 102 with driver location and status. In some examples, the handheld electronic device 134 can be in communication with the call center 102, the key machine 106a, the navigation system 130, the key disposal unit 132, and other system 100 components. In some examples, the handheld electronic device 134 can act as an interface between the driver 124 and the remaining components in the system 100.

In some examples, the handheld electronic device 134 can be in communication with the navigation system 130 (or have its own navigation system), for example, to provide location updates to the call center 102. In some examples, the handheld electronic device 134 can comprise a laser scanner, camera, bar code reader, or other input to enable the driver to scan the item(s) 112 before and during delivery. This can enable the driver 124 to update the status of the delivery automatically, for example, to request keys, activate and deactivate the camera(s) 126, and perform other communication and delivery tasks.

Thus, when the driver 124 crosses the threshold distance 128 or arrives at the secure delivery location 110, for example, the handheld electronic device 134 may contact the call center 102 with updated location information. In some examples, the handheld electronic device 134 may be in communication with the key machine 106a and can automatically start the key manufacturing process. Using secure communications and location information, the handheld electronic device 134 can ensure the temporary key 116 is only manufactured when the driver 124 is near the secure delivery location 110 and that the temporary key 116 is for the correct secure delivery location 110. In other examples, the handheld electronic device 134 may also be in communication with the key disposal unit 132 and can update the status of the delivery when the driver 124 places the temporary key 116 in the key disposal unit 132. Some specific components for an example handheld electronic device 134 are discussed below with reference to FIG. 5.

Figure 2:
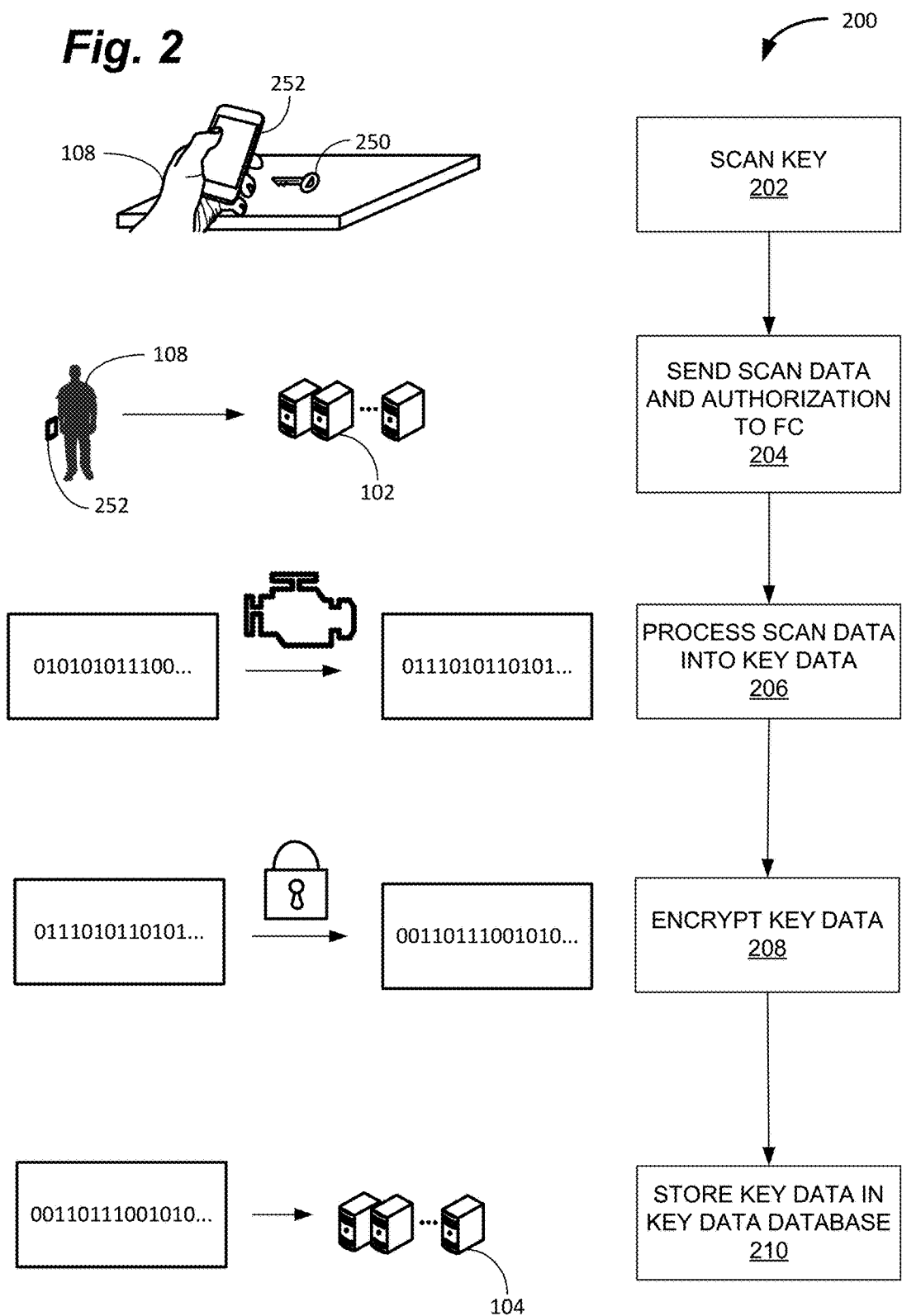
FIG. 2 is a flowchart depicting a key file uploading and storage process, in accordance with some examples of the present disclosure.

As shown in FIG. 2, examples of the present disclosure can also comprise a method 200 for receiving and storing key data. Obviously, a certain level of trust must be established between the provider associated with the call center 102 and the user 108. Thus, the systems and methods described herein provide a secure and monitored method for obtaining key information, or key data. The temporary key 116 created from this key data can then be used to provide access to the user's home, office, or vehicle, among other things.

As discussed in more detail below, key data provided by the user 108 can be used by the key machine 106 to produce the temporary keys 116 that provide access to the secure delivery location 110. Obviously, data that can potentially be used to access the user's house, office, or car warrants a relatively high level of security. To this end, data can be received in a secure manner from the user 108, via the user's smart phone or other device, at, or before, the delivery time for the item(s) 112. The data can then be securely stored and retrieved from the key database 104, processed as necessary, and sent to the key machine 106 only when authorization has been provided by the user 108.

At 202, the user 108 can scan or image a key 250 for the secure delivery location 110 with the user's smart phone 252, or similar device. The key 250 can comprise, for example, a house, car, padlock, or other key to provide access to the secure delivery location 110. In some examples, the user 108 can provide one or more user-generated digital images or image files from the camera of the smart phone 252. In other examples, the user 108 can place the key 250 on a copier or scanner, for example, to provide the necessary user-generated digital images. In still other examples, the user 108 can simply hold the key 250 up to a web cam, or other suitable camera, and rotate it, as necessary, to obtain the necessary type or number of images. The number of images required can depend on the key, the resolution of the camera, and the type of imaging (e.g., still vs. video imaging).

In some examples, the number and type of images used may be at least partially dependent on the type of key 250. In other words, a simple padlock key for a known brand (e.g., Masterlock®) may require only a single image to reproduce. In other words, in some examples, the key may be the same on both sides and require only one image to reproduce. A "laser-cut" key for a vehicle, on the other hand, or other more complex keys, may require multiple images from multiple angles to accurately reproduce. Thus, the number of images required may be based on the complexity of the teeth, the number of safety features included on the key, the key blank, or other factors.

At 204, regardless of how the image(s) are obtained and how many are required, the user 108 can securely send the images and authorization to use the images to the call center 102 with the smart phone 252. This can be accomplished by encrypting and uploading the images to a website associated with the call center 102, for example, or via an app associated with the call center 102, sending an e-mail, or other suitably secure means. Regardless of the program used, the images can be encrypted and/or password protected for security in transit.

In some examples, the user 108 can also include an authorization to use the images to (1) create temporary keys and/or (2) make secure deliveries. In some examples, the user 108 can provide authorization for all deliveries. In other words, the user's profile can include one or more secure delivery locations 110. The user 108 can then authorize the call center 102 to deliver all orders to one or more predetermined secure delivery locations 110. In some cases, the user can provide a default secure delivery location 110—i.e., "use the garden shed 122 unless otherwise instructed." In other examples, the user can choose the secure delivery location each time an order is placed, for example, along with the method of payment and other features. In other examples, the user can provide authorization to store the images for use on specific deliveries—i.e., the user 108 can authorize secure deliveries on a case-by-case basis. In some examples, the user 108 can also provide instructions regarding what to do with the temporary key 116 (e.g., destroy the temporary key 116, leave it inside, etc.). In some examples, the user 108 can also provide instructions regarding what to do with the item(s) 112 during a secure delivery (e.g., place them inside, put them in the refrigerator, etc.).

In still other examples, rather than (or in addition to) providing secure deliveries, the call center 102 can essentially act as an online locksmith. In this configuration, rather than, or in addition to, placing orders with the call center 102, the user can also request replacement keys from the call center 102. In this manner, if the user 108 locks their keys in the vehicle 120, for example, or is locked out of the house 118, the user 108 can simply order replacement keys from the call center 102. Thus, in some cases, in addition to, or instead of, providing authorization for secure deliveries, the user 108 can also provide authorization for key replacement.

When used as an online blacksmith, the call center 102 may create "permanent" keys. In other words, in this capacity, the call center 102 can manufacture keys from conventional materials, such as metal, to provide a key with a "normal" lifespan. In some examples, the call center 102 may use the same key machine 106 used for temporary keys 116, but with different blanks. In other examples, the call center 102 may use a dedicated key machine for permanent keys.

At 206, the call center 102, or other entity, can process the images into key data. In some examples, this can include combining the one or more images from the user 108 into one or more 3-D images of the key 250. This can also include processing the image(s) into a computer aided design (CAD) file, or other suitable file type. This can be done using a suitable software solution that automatically converts the images into CAD files. This can also be done manually, with a technician essentially tracing the key into a CAD file.

In some examples, processing the images into key data can also include selecting an appropriate key blank. The key machine 106, for example, can contain a plurality of key blanks or base stocks that coincide with the size and shape of various keys. All keys from a particular manufacturer (e.g., Schlage® or Kwikset®), for example, may use the same thickness base stock or the same blank (or a limited number of blanks). Car keys, on the other hand, can be designated by manufacturer, model, year, or other means. In some examples, when CNC manufacturing processes (e.g., CNC machining or 3-D printing) are used, all that may be required is the key thickness. The remaining features—e.g., teeth, grooves, and stops—may simply be machined into stock material or printed.

As mentioned above, in some examples, the system 100 can use different base stocks for temporary keys 116 vs. permanent keys. The system 100 may print or machine temporary keys 116 from polymer, paper, or other temporary materials, for example; yet, print or machine permanent keys from metal, or other more durable materials.

At 208, to prevent unauthorized access to the key data, the key data can be appropriately encrypted. In this manner, the key database 104, firewalls, password protection, and other means can provide the initial layers of protection, while individual file encryption can provide yet another layer of encryption. Access to the key data can be limited to appropriate personnel or components at the call center 102, for example, at the appropriate time to effect a secure delivery and/or provide key replacement when needed. In some examples, receiving image data, conversion to key data, and/or storage and encryption of key data can be handled automatically using appropriately secure applications, essentially removing the human element from the method 200.

In some examples, substantially all access to, and use of, the key data can be tracked and stored in the key database 104, for example, or in the user's account. Thus, substantially all incidences of creation, use, and destruction/disposal of keys, among other things, can be tracked and logged in a key log for review by the user, the call center 102, and others. In some examples, use of the key data can be tracked using, for example, access logs, ledgers, or blockchain technology. A blockchain, or block chain, is a distributed database that maintains a continuously growing list of records called blocks secured from tampering and revision. Each block contains a timestamp and a link to a previous block. See, e.g., "Blockchain (database)", Wikipedia (Oct. 18, 2016). Thus, the key log can comprise a blockchain including all instances of access to the key database 104 and/or each temporary key 116 creation, use, or destruction/disposal for each secure delivery location 110.

At 210, the key data can be stored in the key database 104. The key database 104 can comprise one or more servers, computers, laptops, cloud storage solutions, or other means for securely storing the key data. Each key data file can be associated with a particular user 108 or secure delivery location 110, for example, for later retrieval. Access to the key database 104 can be restricted to particular users and/or applications on a need-to-know basis. In some examples, access to the key data can be limited to personnel and/or components at the call center 102. In this manner, a particular key data file can only be accessed by an appropriate person or application in response to secure deliver or key request, for example. In some examples, a code or key can be generated only at the time the special delivery order is placed. As discussed above, a log of all access to the key database 104, key creation, key use, and key destruction/disposal can be maintained for each secure delivery location 110 or key file, among other things.

Figure 3A:
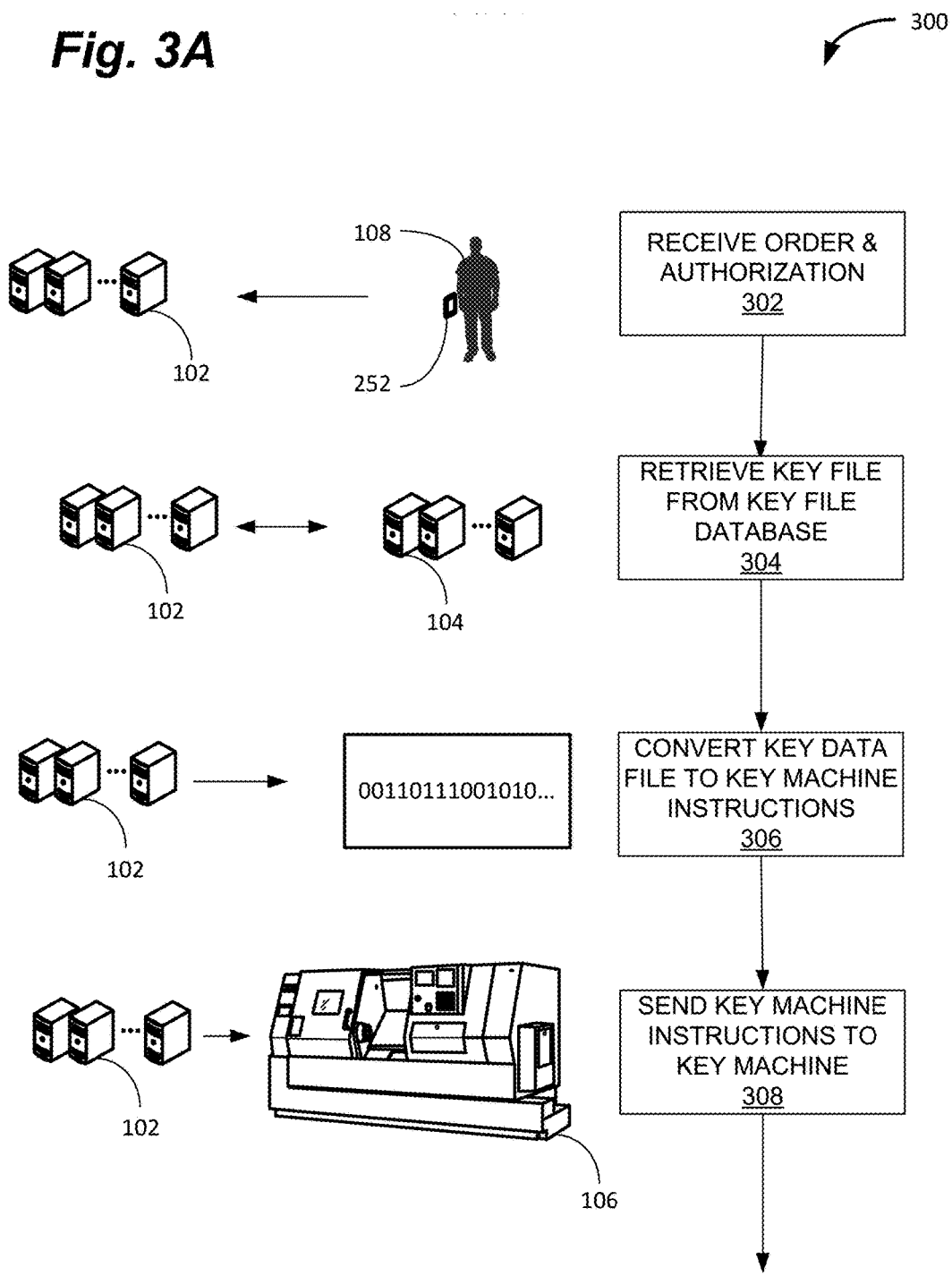
FIGS. 3A and 3B are flowcharts depicting an order fulfillment method with key creation, in accordance with some examples of the present disclosure.
Figure 3B:
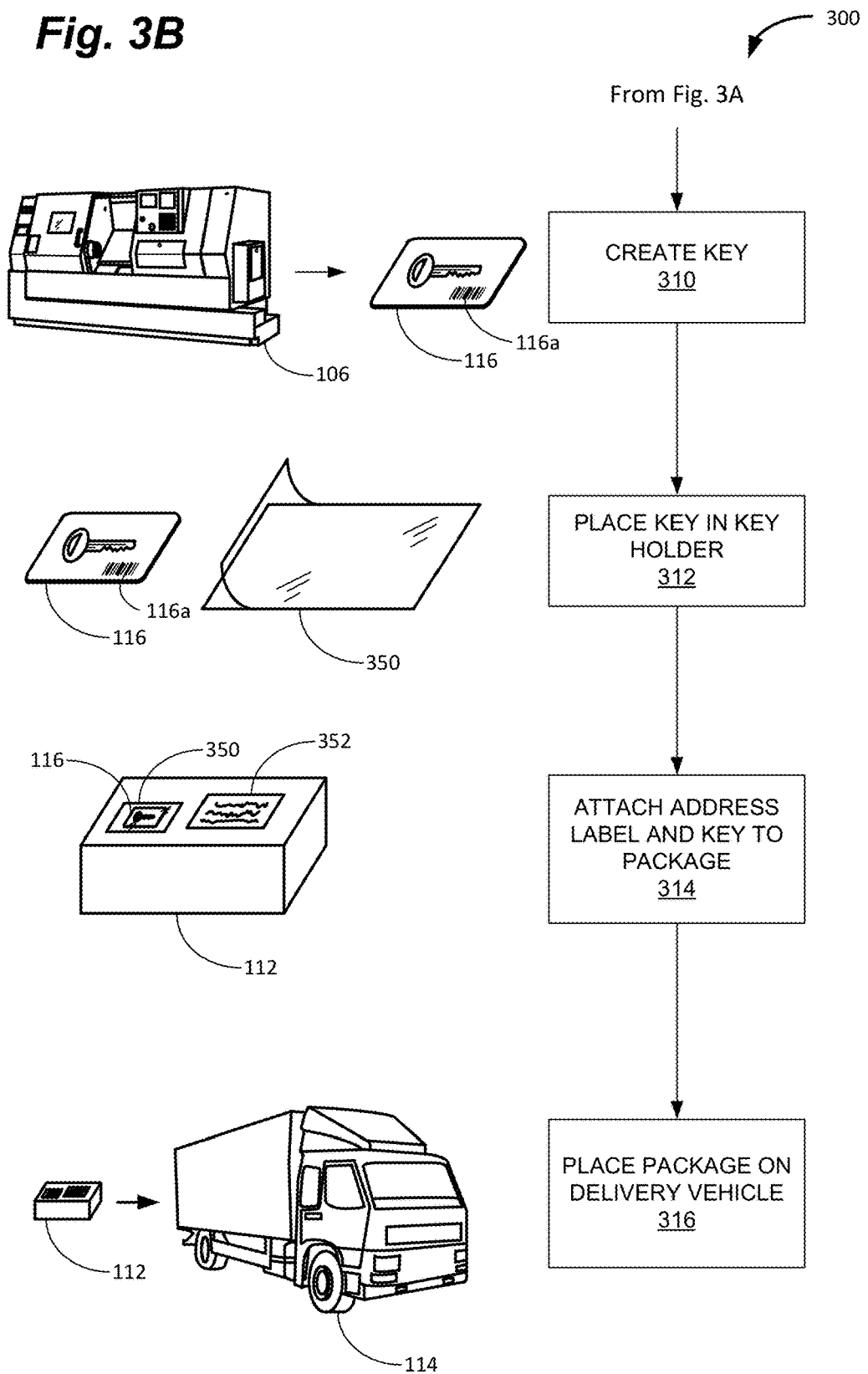

As shown in FIGS. 3A and 3B, examples of the present disclosure can also comprise a method 300 for fulfilling orders for secure delivery. At 302, the call center 102 can receive a request for a secure delivery from the user 108. As mentioned above, this can include receiving an order from an application on the smart phone 252, for example, from a website, or at a call center associated with the call center 102.

As mentioned above, in some cases, the user 108 may have already provided authorization for the secure delivery (e.g., the user 108 has authorized that all deliveries are to be performed via secure delivery). In other examples, the user may provide authorization on a case-by-case basis. In this configuration, the user 108 can provide authorization at the time the order is placed. Authorization can be provided by the user via a secure application, for example, using a password or fingerprint, among other things.

In some examples, the user 108 may have already provided delivery preferences (e.g., with their authorization for secure delivery). In other examples, the user 108 can also provide delivery preferences at the time of order. This may include specifying the secure delivery location 110 to use (e.g., vehicle 120 vs. garden shed 122). This can also include whether to leave the item(s) 112 just inside the door or place some or all of the item(s) 112 in the refrigerator. This can also include what to do with the temporary key 116—e.g., leave the temporary key 116 in secure delivery location 110 or destroy the temporary key 116, among other things.

At 304, the call center 102 can retrieve the key data for the user 108 from the key database 104. As mentioned above, in some examples, this can be done automatically by a computer at the call center 102 (or in another location) in communication with the key database 104. In other examples, an authorized worker at the call center 102 can retrieve the key data associated with the user 108 and/or the secure delivery location 110 from the key database 104 using appropriate security measures such as, for example, a password, fingerprint or other biometric scan, or smart card.

In some examples, the temporary keys 116 can be produced in batches for all of the item(s) 112 on the delivery vehicle 114, for example, or all items being shipped at the same time (regardless of which delivery vehicle 114). In other words, the call center 102 can create a plurality of temporary keys 116 for a plurality of secure delivery locations 110, each temporary key 116 with a unique identifier 116a (e.g., an identification number, bar code, or other indication) for the secure delivery location 110 associated with each of the temporary keys 116. In this manner, the call center 102 has no knowledge of which temporary key 116 works with which secure delivery location 110. Indeed, as discussed below, the driver 124 may only become aware of the secure delivery location 110 at the time of delivery.

In this configuration, the driver 124 can access the identifier 116a upon crossing the threshold distance 128, for example, or arriving at the secure delivery location 110. In this manner, the secure delivery location 110 associated with each temporary key 116 is unknown until the last minute, improving security. In some examples, the driver 124 can access the item(s) 112, scan the identifier 116a (or the shipping label 352) with the handheld electronic device 134, and then receive information based on the identifier 116a (e.g., a key number, address, or other information). This can enable the driver 124 to identify the correct temporary key 116 for the secure delivery location 110, but not until he arrives, for example.

At 306, optionally, the call center 102, a key application, or other application or entity can convert the key data into key machine instructions. The key application can include programming to convert the key data from a CAD file into a computer aided manufacturing (CAM) file that can be used by the key machine 106 to manufacture the temporary key 116. In other examples, the key machine 106 may be capable of interpreting images or CAD files directly, obviating this step. In still other examples, the key application can be run, and key data can be converted to key machine instructions, prior to storage in the key database 104, which also obviates the conversion process.

At 308, the key machine instructions (or key data) can be sent to the key machine 106. As mentioned above, the key machine 106 can utilize CNC manufacturing processes and can comprise, for example, a CNC milling machine, a waterjet cutter, a 3-D printer, or other CNC controlled subtractive or additive manufacturing process. The key machine 106 can enable the temporary key 116 to be manufactured quickly (e.g., within minutes in some cases) and in a location within, or close to, the call center 102 where the item(s) 112 are being prepared. In some examples, the key machine 106 can be on the processing line in the call center 102 where orders are fulfilled and packaged. In this manner, the temporary key 116 can be attached to the item(s) 112 along with the shipping label and other components.

In other examples, the temporary key 116 can be kept in a separate location than the item(s) 112 and can include a code, symbol, bar code, or other anonymous indicator. In this configuration, the driver 124 may cross-reference the code using a secure database on the handheld electronic device 134, for example, or receive the code from the call center 102 at (or near) the time of the delivery. Thus, if a temporary key 116 is misplaced or stolen, for example, the address associated with the temporary key 116 is unknown. In still other examples, as discussed above, the temporary key 116 can be manufactured on the delivery vehicle 114 at (or near) the time of the delivery to minimize exposure of the temporary key 116.

At 310, the key machine 106 can manufacture the temporary key 116. In some examples, as shown, the temporary key 116 can be cut out of a piece of cardstock, plastic, or other suitable material and can be kept in the card until it is needed. In some cases, the temporary key 116 can be completely cut out to form a substantially "normal" key, albeit from a temporary material. As discussed above, the temporary key 116 can be manufactured at, or near, the time the order is placed so that it can be easily coupled to the item(s) 112.

At 312, in some examples, the temporary key 116 can be placed in a key holder 350. In some examples, the key holder 350 can comprise a sealable and/or tamper-evident envelope. In this manner, if there is unauthorized access to the temporary key 116—e.g., to make a copy prior to delivery—the unauthorized access will be obvious. As discussed below, initial access to the temporary key 116 by the driver 124 at the secure delivery location 110 can be provided in the video from the camera(s) 126. This can provide the user 108 with evidence that the temporary key 116 has not been previously accessed to make a copy, take a picture, or otherwise misuse the key.

In some examples, the key holder 350 can also be air- and/or watertight. In this manner, hydroscopic or oxidizing materials, for example, can be protected from air or water to prevent the decomposition of the key. In this manner, the temporary key 116 can be attached to the item(s) 112 the night before a delivery, for example, without the key deteriorating. When the driver 124 removes the key from the key holder 350, on the other hand, the breakdown of the temporary key 116 can begin.

In some examples, the key holder 350 can also include an adhesive backing, or other means, to attach the key holder 350 to the item(s) 112. In other examples, the key holder 350 and/or the temporary key 116 can be placed in the same pouch or label holder with the shipping label 352. In still other examples, the temporary key 116 and/or the key holder 350 can simply be taped to the item(s) 112.

At 314, the key holder 350 and the shipping label 352 can be affixed to the item(s) 112. Obviously, the shipping label 352 can provide the address associated with the secure delivery location 110. In some examples, the shipping label 352 can also include specific instructions associated with the secure delivery location 110 such as, for example, the specific location (e.g., in the foyer, refrigerator, garden shed, garage, etc.), a car model, make, color, tag number, vehicle identification number (VIN), or other information. The shipping label 352 can also include additional information for the driver 124 such as, for example, "Beware of dog." or "Please leave front lights on."

In some examples, the shipping label 352 can also include instructions about what to do with the temporary key 116. This can vary based on user 108 preference, lock type, temporary key 116 type, temporary key 116 material, and other factors. Some users 108 may prefer to have the key left in the house 118, for example. Other users 108 may prefer that driver 124 lock the door from the outside (e.g., lock the deadbolt) and then push the temporary key 116 through a mail slot in the door. Still other users 108 may be satisfied with seeing the key destroyed, or properly disposed of, on the video and have no need to receive the actual temporary key 116.

At 316, the item(s) 112 can be placed on the delivery vehicle 114 for delivery. Depending on the items(s) 112, this can be done immediately prior to, hours before, or even days before the departure of the delivery vehicle 114. Where applicable, the key holder 350 can protect the temporary key 116 from deterioration until it is removed from the key holder 350.

Figure 4B:
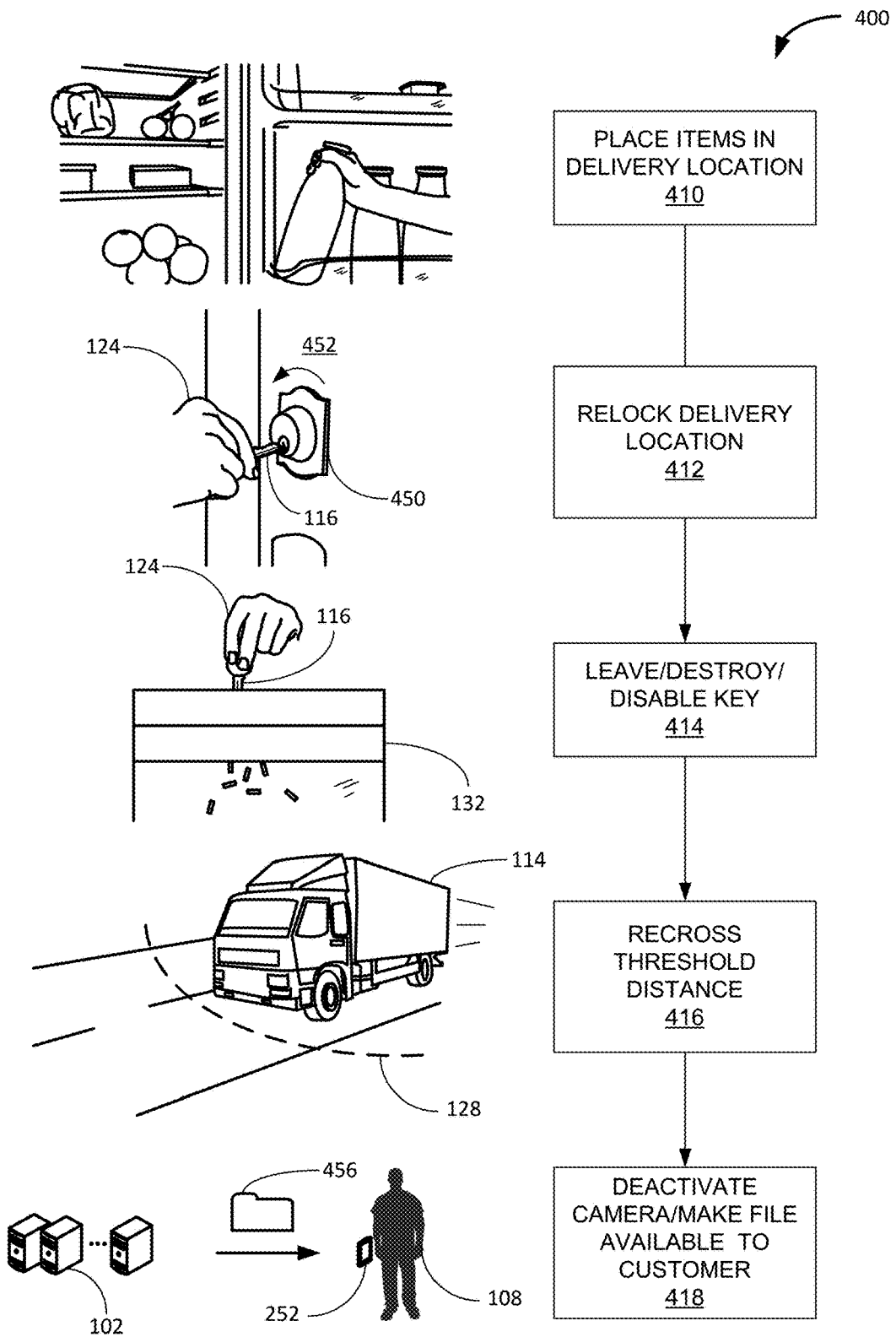

As shown in FIGS. 4A and 4B, examples of the present disclosure can also comprise a method 400 to provide secure deliveries. As discussed above, the method 400 can comprise using a temporary key 116 to access a secure delivery location 110. This can enable a driver 124 to open the front door of the house 118, unlock a vehicle 120 or garden shed 122, or to otherwise access any other secure location designated by the user 108 to deliver the item(s) 112. This may be because the item(s) 112 are particularly valuable, for example, personalized, rare (or irreplaceable), or perishable. In some cases, the driver 124 can place the item(s) 112 inside the front door of the house 118. In other cases, the driver 124 can place some or all of the item(s) 112 directly in the user's freezer or refrigerator to reduce, or eliminate, both spoilage and specialized packaging (e.g., coolers and ice).

At 402, in some examples, the method 400 can start when the delivery vehicle 114 crosses the threshold distance 128. The threshold distance 128 can be set at a predetermined time or distance from the secure delivery location 110. In some examples, the threshold distance 128 can be calculated by the navigation system 130 or the handheld electronic device 134 in the delivery vehicle 114. Thus, the threshold distance 128 can be when the delivery vehicle is within a predetermined distance (e.g., 1 block) or a predetermined time (e.g., 1 minute) of the secure delivery location 110, among other things. In some examples, the threshold distance 128 can be marked by turning onto the street associated with the delivery address, into the driveway of the secure delivery location 110, or other landmark observable by the driver 124, for example, or the handheld electronic device 134.

At 404, if not already on, the camera(s) 126 can be activated. In some examples, the camera(s) 126 can be activated automatically (e.g., by the navigation system 130 or handheld electronic device 134) when the delivery vehicle 114 crosses the threshold distance 128. In other examples, the driver 124 can activate the camera(s) 126 manually upon turning onto the delivery street, arriving at the secure delivery location 110, or other appropriate time prior to retrieving the item(s) 112 from the hold of the delivery vehicle 114. As mentioned above, in some examples, the camera(s) 126 can simply be on all the time and uploaded to the call center 102, delivery vehicle 114, handheld electronic device 134, or other entity when necessary.

At 406, the driver 124 can retrieve the item(s) 112 from the delivery vehicle 114 and access the temporary key 116 for the first time. As mentioned above, the temporary key 116 can be housed in a tamper-evident key holder 350. This prevents the temporary key 116 from becoming separated from the item(s) 112. This also prevents unauthorized—and undocumented—access to the temporary key 116 prior to arriving at the secure delivery location 110. In some examples, the key holder 350 can also prevent the deterioration of the temporary key 116, with its removal from the key holder 350 "starting the clock" on the viability of the temporary key 116. In some examples, the driver 124 may have a very limited time (e.g., 5 minutes) to use the temporary key 116 before it becomes unusable.

In some cases, the temporary key 116 and/or the key holder 350 may become damaged in transit, for example, or during packaging. In this case, procedures can be put in place to deal with an innocently damaged key holder 350. In other words, it is possible for the key holder 350 to be damaged in transit from boxes shifting in the delivery vehicle 114, for example, or due to rough handling at the call center 102, among other things. In this case, if the driver 124 notices a damaged key holder 350 upon retrieving the item(s) 112, he can take additional actions.

In some cases, the driver 124 can simply return the item(s) 112 to the delivery vehicle 114, for example, and designate the item(s) 112 as undeliverable (e.g., using a handheld electronic device). In this manner, the driver 124 has video evidence that he has not entered the secure delivery location 110. While this does not preclude the possibility that an unauthorized copy of the temporary key 116 was made, at least the driver 124 has evidence that he has not entered the secure delivery location 110.

In other cases, long-time and/or frequent users 108 of the system 100 may have the utmost faith and trust in the system 100. In this case, the driver 124 (or a dispatcher) may contact the user 108 and request permission to continue with the delivery. In some cases, the driver 124 may provide some explanation such as, for example, the key holder 350 was clearly damaged in transit by falling boxes. The driver 124 may also provide video evidence showing the state of the delivery vehicle 114 when he opened it, for example.

In some cases, as discussed above, rather than removing the temporary key 116 from the key holder 350, the temporary key 116 can be manufactured by the key machine 106a on the delivery vehicle 114. In some examples, the handheld electronic device 134 or the navigation system 130 may automatically prompt the key machine 106a to start the manufacturing process upon crossing the threshold distance 128. In other examples, the driver 124 can request the temporary key 116 via the key machine 106a or handheld electronic device 134 at the appropriate time. In some examples, the location of the delivery vehicle 114 can be verified (e.g., with the navigation system 130 or handheld electronic device 134) prior to activating the key machine 106a.

In still other examples, the driver 124 can have a plurality of temporary keys 116 for a plurality of secure delivery locations 110. In this configuration, each temporary key 116 can have a unique identifier 116a (e.g., an identification number, symbol, or other designator). Upon arriving at the secure delivery location 110, crossing the threshold distance 128, or at some other point in the delivery, the driver 124 can access the item(s) 112, scan the item(s) 112 (or the shipping label 352), and then receive a key number, address, or other information associating a temporary key 116 with a secure delivery location 110.

At 408, if the key holder 350 was not damaged (or the driver 124 has obtained any necessary additional permissions) or the temporary key 116 has been manufactured, the driver 124 can access the secure delivery location 110 using the temporary key 116. As shown, for a house 118 delivery, the driver 124 can unlock the deadbolt 450 and/or door handle of the front (or the side, rear, basement, garage, etc.) door 452 to enter the house 118. Similarly, for delivery to a vehicle 120, the driver 124 can use the temporary key 116 to open a car door or trunk to deliver the item(s) 112. If the secure delivery location 110 is a garden shed 122, for example, the driver 124 can use the temporary key 116 to unlock the door or remove a padlock, as applicable, to make the delivery.

At 410, the driver 124 can place the item(s) 112 inside the secure delivery location 110. For non-perishable items, the driver 124 may simply open the door 452, place the item(s) 112 in the foyer, and then close the door 452. In this manner, the driver 124 has minimized the time and extent of his entry into the secure delivery location 110. In other cases, such as when one or more of the item(s) 112 are perishable, the driver 124 may access the house 118 or garage, for example, and place some or all of the item(s) 112 in the user's refrigerator 454 and/or freezer. In this manner, the perishable items are kept cool in the refrigerator or freezer and little or no additional packaging or ice is required.

Indeed, the driver 124 may nonetheless use a cooler, or other special packaging, which can be reused by the driver 124 once unloaded. In other words, because the driver 124 can unload the perishable items into the refrigerator 454 or freezer, for example, it is not necessary for the driver 124 to leave the cooler, ice packs, or other paraphernalia behind. Thus, items can be kept fresh and unblemished without the additional cost of disposable coolers and other specialized packaging that are left behind at the secure delivery location 110. This can enable the delivery of especially sensitive items such as, for example, fresh seafood and ice cream, which may otherwise be undeliverable due to their extreme perishability.

At 412, the driver 124 can leave the secure delivery location 110 and relock the door 452 (e.g., front door, car door, shed door, etc.). In some cases, the driver 124 can simply lock the door handle, for example, and close the door 452. In this configuration, at the user's request, the driver 124 may simply leave the temporary key 116 inside the secure delivery location 110. In other examples, the driver 124 may need the temporary key 116 to lock the deadbolt 450 on the door 452, lock the vehicle 120 door from the outside, or otherwise relock the door 452. In this case, the driver 124 can lock the door 452 from the outside using the temporary key 116.

At 414, after the driver 124 relocks the door 452 (by whatever means necessary), the driver 124 can leave, destroy, or otherwise disable the temporary key 116. In some examples, the driver 124 can slide the temporary key 116 under the door 452 after relocking it. In other cases, the driver 124 can place the temporary key 116 in a mail slot, mailbox, or other secure location. In other examples, the temporary key 116 may simply dissolve from exposure to the air, for example, after a predetermined amount of time.

In still other examples, the driver 124 can destroy the temporary key 116. As discussed above, the delivery vehicle 114 can include a key disposal unit 132, such as a shredder, for example, to destroy the temporary key 116. In other examples, the temporary key 116 can be ripped up, broken, shattered, placed in water, or otherwise destroyed to prevent future use.

In some examples, the temporary key 116 can include a radio frequency identification (RFID) chip (or similar) and the key disposal unit 132 can include an RFID reader (or similar). In this configuration, the key disposal unit 132 can identify the temporary key 116 just prior to its destruction, which can be recorded on video. In this manner, the user 108 is assured the correct temporary key 116 was destroyed. In some examples, the verification of the temporary key 116 and the destruction of the temporary key 116 can be included in the key log (e.g., in the blockchain). In some examples, the cessation of a signal from the RFID chip can be used as verification that the temporary key 116 has been destroyed.

At 416, the driver 124 can leave the secure delivery location 110 and the delivery vehicle 114 can re-cross the threshold distance 128. This can be the end of the driveway, the end of the block, a predetermined distance (e.g., ¼ mile), or a predetermined travel time away from the secure deliver location, among other things. As before, the threshold distance 128 can be determined automatically by the navigation system 130 or handheld electronic device 134, for example, or manually entered by the driver 124 on the handheld electronic device 134, among other things.

At 418, after crossing the threshold distance 128, the camera(s) 126 can be automatically, or manually, deactivated. As before, this can be done automatically by the system 100 in response to a signal from the navigation system 130 or handheld electronic device 134, for example, by a timer, or manually by the driver 124. In some examples, a file 456 containing the video from the delivery can be sent to the user 108, uploaded to a website or remote server, or archived, among other things. The file 456 can be available on the user's online account, for example, in the "order status" or "order summary" section of a website, or on a remote server dedicated to storing video files 456.

Recording the delivery from start to finish can build trust with the user 108 and provide accountability. Because the video can include the driver 124 removing the temporary key 116 from the key holder 350, for example, the user 108 is provided with some level of comfort that the temporary key 116 has not otherwise been misused or copied. Similarly, because the driver's entry into the house 118 or vehicle 120 is recorded, any potential theft, damage, or other misuse is both dissuaded and recorded. Finally, video evidence that the temporary key 116 has been left at the secure delivery location 110 or destroyed provides additional assurances that unauthorized access to the secure delivery location 110 with the temporary key 116 will not occur in the future.

In some examples, the video can also include timestamps for various significant events during the delivery. The video may include a timestamp when the temporary key 116 is created, the driver 124 unlocks the door 452, the driver locks the door 452, when the temporary key 116 is destroyed (or left at the secure delivery location 110), etc. In some examples, such as when the temporary key 116 is created and destroyed on the delivery vehicle 114, the video can include a timestamp for when the temporary key was created and then destroyed. If a temporary key 116 is created at 4:01 PM and is destroyed at 4:06 PM, this assures the user 108 that (1) the temporary key 116 existed for only 5 minutes and (2) the driver 124 was in the secure delivery location 110 for at most 5 minutes.

In some examples, the key disposal unit 132 can also provide an image of the temporary key 116 and/or a timestamp immediately prior to (and immediately after) the temporary key 116 being destroyed. This can enable the user 108 to verify that the correct temporary key 116 (e.g., the one for the secure delivery location 110) is destroyed. In this manner, the user 108 can compare the temporary key 116 to their own key 250, for example, to ensure the tooth pattern, or other features, match.

Figure 5:
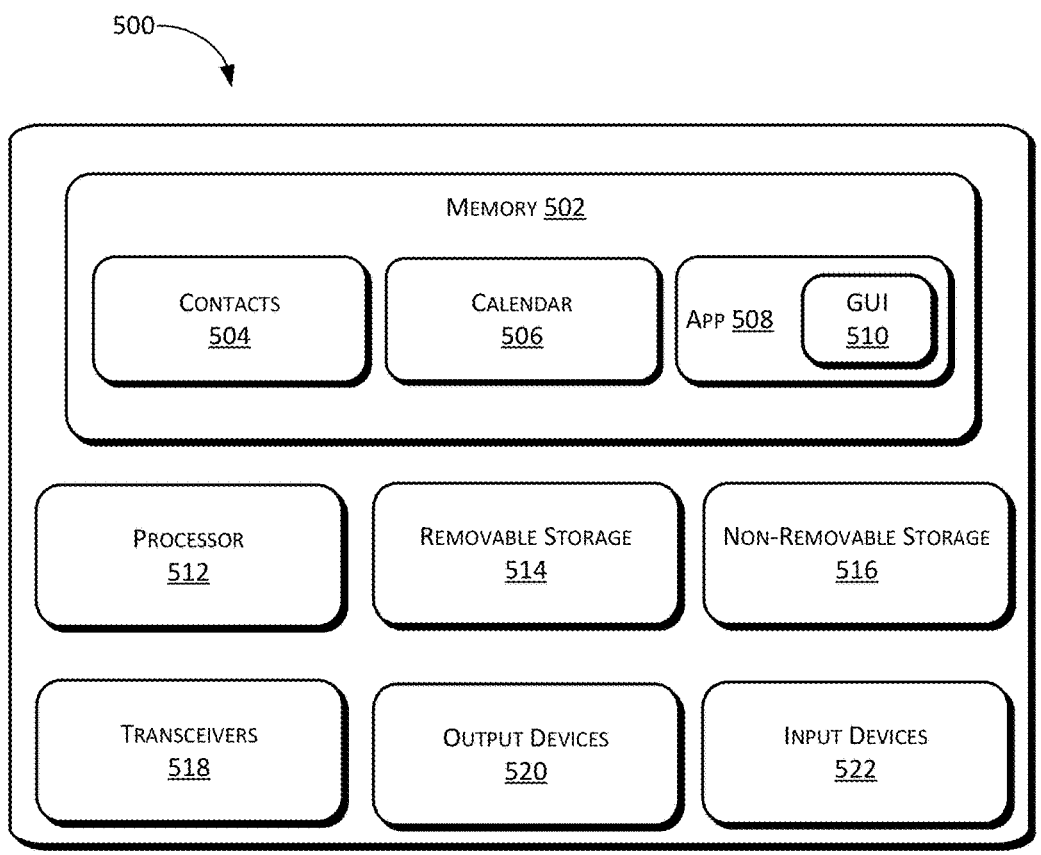
FIG. 5 is a component level schematic for a handheld electronic device for use with the system, in accordance with some examples of the present disclosure.

As shown in FIG. 5, the handheld electronic device 134, the call center 102, and the smart phone 252 can be implemented on a variety of electronic devices, such as cell phones, smart phones, tablet computers, and laptops. Thus, while described below in the context of the smart phone 252, one of skill in the art will recognize that other system 100 components, such as the call center 102 and the handheld electronic device 134, could be implemented with the same, or similar, components.

The smart phone 252 can comprise a number of components to enable it to run an application, or access a website, for example, for use with the system 100 and methods 200, 300, 400 to perform the above-mentioned functions. To this end, the smart phone 252 can comprise memory 502 including many common features such as, for example, the user's contacts 504 and calendar 506. In addition, the memory 502 can also include an app 508, which may include a graphical user interface (GUI) 510 to enable the user to upload key data, for example, place orders, and provide secure delivery authorization, among other things. The smart phone 252 can also include one or more processor(s) 512, removable storage 514, non-removable storage 516, transceivers 518, output device(s) 520, and input device(s) 522.

In various implementations, the memory 502 can be volatile (such as random access memory, or RAM), non-volatile (such as read-only, or ROM, flash memory, etc.), or some combination of the two. The memory 502 can also comprise contacts 504. As the name implies, the contacts 504 can include names, numbers, addresses, and other information about the user's acquaintances and contacts. In some examples, the memory 502 can also include a calendar 506, or other software, to enable the user to track appointments and calls, schedule meetings, and provide similar functions. Of course, the smart phone 252 can also include other software such as, for example, navigation, e-mail, text messaging, social media, and utilities (e.g., calculators, clocks, compasses, etc.).

The smart phone 252 can also comprise the app 508. In some examples, the app 508 can provide the GUI 510 to enable the user to easily take pictures of one or more keys 250, upload the key images to the call center 102, provide authorization for secure deliveries, and place orders from the call center 102. In some examples, at setup, the app 508 can prompt the user 108 to take one or more images of the key 250 for use by the system 100. In some examples, the GUI 510 can provide a window, for example, to assist the user 108 in properly framing the key 250 or obtaining images at the necessary angles to properly reproduce the key 250.

In some examples, the app 508 can also compress, encrypt, package, and otherwise process the images prior to sending the images to the call center 102. In some examples, the app 508 can then send the images to the call center 102, for example, or the key database 104, as appropriate. In some examples, the call center 102, or the key database, may require authorization from the user 108, via the app 508, prior to authorizing a secure delivery and/or making a temporary key 116.

The app 508 can also receive the user's preferences regarding secure deliveries. In other words, the app 508 can enable the user 108 to designate one or more secure delivery locations 110, to set a default secure delivery location 110, and to store one or more methods of payment. In other examples, the app 508 can also enable the user to specify what types of deliveries to designate for secure delivery. The user 108 may choose any delivery in excess of a set dollar value, all groceries, to be prompted during each order for a choice of deliver type, or a combination thereof. Thus, the user 108 may request that any delivery over $500, for example, be delivered by secure delivery, any order under $50 be delivered by regular delivery, and any value in between $50 and $500 requires a response from the user 108 when ordering.

In some examples, the app 508 can also enable the user 108 to shop and order from the call center 102. Thus, the GUI 510 may provide a shopping interface in which the user 108 chooses one or more items 112, designates a secure delivery location 110, and provides authorization for secure delivery. In this manner, the app 508 can provide a "one-stop" solution for setting up, ordering, and receiving bit secure and regular deliveries.

The smart phone 252 may also include additional data storage devices (removable and/or non-removable) such as, for example, magnetic disks, optical disks, or tape. Such additional storage is illustrated in FIG. 5 by removable storage 514 and non-removable storage 516. The removable storage 514 and non-removable storage 516 can store the various programs and algorithms to enable the smart phone 252 to be fully or partially configured and to enable the app 508 and/or GUI 510 to present welcome screens, setup menus, and other functions to the user via the app 508, GUI 510, operating system (OS), and/or other programs and functions.

Non-transitory computer-readable media may include volatile and nonvolatile, removable and non-removable tangible, physical media implemented in technology for storage of information, such as computer readable instructions, data structures, program modules, or other data. The memory 502, removable storage 514, and non-removable storage 516 are all examples of non-transitory computer-readable media. Non-transitory computer-readable media include, but are not limited to, RAM, ROM, electronically erasable programmable (EEPROM) memory, flash memory or other memory technology, compact disc-ROM (CD-ROM), digital versatile disks (DVD) or other optical storage, magnetic cassettes, magnetic tape, magnetic disk storage or other magnetic storage devices, or any other tangible, physical medium which can be used to store the desired information and which can be accessed by the smart phone 252. Any such non-transitory computer-readable media may be part of the smart phone 252 or may be a separate database or databank.

In some implementations, the transceivers 518 include any sort of transceivers known in the art. For example, the transceivers 518 may include wireless (e.g., 802.11x) and cellular (e.g., 3G, 4G, 4G LTE, etc.) communications modems. The transceivers 518 may also include wired communication components, such as a wired modem or Ethernet port, for communicating with, for example, the call center 102, the key database 104, or the provider's cellular or Internet-based network. Further, the transceivers 518 may include a radio transceiver that performs the function of transmitting and receiving near-field radio frequency communications via an antenna (e.g., WiFi or Bluetooth®).

In some implementations, the output devices 520 include any sort of output devices known in the art, such as a display (e.g., a liquid crystal displays (LCDs) or thin-film transistor (TFT) display), a touchscreen display, speakers, a vibrating mechanism, or a tactile feedback mechanism. In some examples, the output devices can play various sounds based on, for example, whether the app 508 is being opened for the first time, has been configured, and/or is connected to various other services. Output devices 520 also include ports for one or more peripheral devices, such as headphones, peripheral speakers, or a peripheral display.

In various implementations, output devices 520 include any sort of input devices known in the art. For example, output devices 520 may include the aforementioned camera, a microphone, a keyboard/keypad, or a touch-sensitive display. A keyboard/keypad may be a standard push button alphanumeric, multi-key keyboard (such as a conventional QWERTY keyboard), a touchscreen, or one or more other types of keys or buttons, and may also include a joystick, wheel, and/or designated navigation buttons, or the like.

While several possible examples are disclosed above, examples of the present disclosure are not so limited. For instance, while systems and methods for delivering item(s) 112 with disposable keys 116 has been disclosed, other devices (e.g., disposable garage door openers or gate cards) could be used to access the delivery location without departing from the spirit of the disclosure. In addition, the location and configuration used for various features of examples of the present disclosure such as, for example, the order of steps, the components of the delivery system 100, the location and type of key machine 106, the type of handheld electronic device 134, and other features can be varied according to a particular call center 102, for example, or delivery vehicle 114 that requires a slight variation due to, for example, the size or construction of the call center 102, the type of delivery vehicle 114, or the types of item(s) 112 being delivered. Such changes are intended to be embraced within the scope of this disclosure.

The specific configurations, machines, and the size and shape of various elements can be varied according to particular design specifications or constraints requiring a device, system, or method constructed according to the principles of this disclosure. Such changes are intended to be embraced within the scope of this disclosure. The presently disclosed examples, therefore, are considered in all respects to be illustrative and not restrictive. The scope of the disclosure is indicated by the appended claims, rather than the foregoing description, and all changes that come within the meaning and range of equivalents thereof are intended to be embraced therein.

What is claimed is:

1. A system to provide a secure delivery to a secure delivery location, the system comprising:
    a key database comprising at least a key data file associated with a permanent physical key configured to unlock a lock at the secure delivery location;
    a key application to convert the key data file into key machine instructions;
    a key machine residing on a delivery vehicle and to:
        receive the key machine instructions at least partly in response to a determination that the delivery vehicle is within a predetermined distance of the secure delivery location; and
        manufacture a temporary physical key for the lock at the secure delivery location using the key machine instructions; and
    a disposal unit to destroy the temporary physical key;
    wherein a driver uses the temporary physical key to unlock the lock to access the secure delivery location to deliver one or more items; and
    wherein the driver destroys the temporary physical key with the disposal unit after delivering the one or more items to the secure delivery location.

2. The system of claim 1, wherein the key data file comprises one or more user-generated digital images of the permanent physical key configured to unlock the lock at the secure delivery location.

3. The system of claim 1, wherein the key application converts the key data file into a key computer aided design (CAD) file; and
    wherein the key machine utilizes computer numerically controlled (CNC) manufacturing to manufacture the temporary physical key.

4. The system of claim 1, further comprising:
    one or more wearable cameras to record at least a portion of the secure delivery, the one or more wearable cameras to be worn by the driver;
    wherein the one or more wearable cameras are activated when the driver crosses a threshold distance proximate the secure delivery location to record the secure delivery; and
    wherein the one or more wearable cameras are deactivated when the driver re-crosses the threshold distance.

5. The system of claim 4, wherein the one or more wearable cameras comprise a 360-degree view of an area proximate the driver.

6. A method comprising:
    receiving a request for a delivery of one or more items from a user associated with a secure delivery location;
    retrieving a key data file from a key database, the key data file associated with a physical key configured to unlock a lock at the secure delivery location;
    determining that a delivery vehicle carrying the one or more items is within a predetermined distance from the secure delivery location;
    sending the key data file to a key machine located on the delivery vehicle at least partly in response to the determining;
    creating, with the key machine and using the key data file, a temporary physical key for the lock at the secure delivery location; and
    associating the temporary physical key with the one or more items associated with the delivery.

7. The method of claim 6, further comprising:
    sending the key data file from the key database to a key application to convert one or more digital images in the key data file into computer aided design (CAD) file for use by the key machine.

8. The method of claim 6, wherein associating the temporary physical key with the one or more items comprises placing the temporary physical key in a tamper-evident key holder and attaching the tamper-evident key holder to one of the one or more items.

9. The method of claim 6, wherein creating the temporary physical key for the lock at the secure delivery location comprises 3-D printing the temporary physical key.

10. The method of claim 6, wherein creating the temporary physical key for the lock at the secure delivery location comprises cutting the temporary physical key out of base stock using a computer numerically controlled (CNC) process.

11. The method of claim 10, further comprising:
- determining, using the key data file, a thickness associated with the physical key configured to unlock the lock at the secure delivery location;
- determining, from a plurality of base stocks each having a different thickness, a first base stock corresponding to the thickness; and
- selecting the first base stock from which to cut the temporary physical key.

* * * * *